United States Patent
Kaminski et al.

(10) Patent No.: US 6,501,145 B1
(45) Date of Patent: Dec. 31, 2002

(54) SEMICONDUCTOR COMPONENT AND METHOD FOR PRODUCING THE SAME

(75) Inventors: Nando Kaminski, Suhr (CH); Raban Held, Mömbris (DE)

(73) Assignee: DaimlerChrysler AG, Stuttgart (DE)

( * ) Notice: Subject to any disclaimer, the term of this patent is extended or adjusted under 35 U.S.C. 154(b) by 0 days.

(21) Appl. No.: 09/424,991

(22) PCT Filed: May 22, 1998

(86) PCT No.: PCT/EP98/03010
§ 371 (c)(1),
(2), (4) Date: Mar. 3, 2000

(87) PCT Pub. No.: WO98/56043
PCT Pub. Date: Dec. 10, 1998

(30) Foreign Application Priority Data

Jun. 3, 1997 (DE) .......................... 197 23 176

(51) Int. Cl.$^7$ ............................ H01L 27/095
(52) U.S. Cl. .................. 257/471; 257/472; 257/473; 257/474; 257/475; 257/476; 257/484; 257/485
(58) Field of Search ................. 257/471, 472, 257/473, 474, 475, 476, 484, 485, 449

(56) References Cited

U.S. PATENT DOCUMENTS

| | | | | |
|---|---|---|---|---|
| 5,017,976 A | * | 5/1991 | Sugita ...................... 357/15 |
| 5,041,881 A | * | 8/1991 | Bishop et al. ............. 357/15 |
| 5,166,760 A | * | 11/1992 | Mori et al. ................ 257/260 |
| 5,262,669 A | | 11/1993 | Wakatabe et al. |
| 5,753,960 A | * | 5/1998 | Dickmann ................. 257/458 |
| 6,097,046 A | * | 8/2000 | Plumton ................... 257/266 |

FOREIGN PATENT DOCUMENTS

| | | |
|---|---|---|
| DE | 196 33 183 A1 | 2/1992 |
| DE | 42 10 402 A1 | 10/1992 |
| DE | 295 04 629 U1 | 8/1995 |
| EP | 0 380 340 A2 | 8/1990 |

OTHER PUBLICATIONS

Itoh et al. "Excellent Reverse Blocking Characteristics of High–Voltage 4H–SIC Schottky Rectifers with Boron–Implanted Edge Termination"; IEEE Electron Devices Letter; vol. 17, No. 3, Mar. 1, 1996, pp. 139–141.

Mohammad et al "Near–Deal Platinum–Gan Schottkymdiods"; Electronic Letters, vol. 32, No. 6, Mar. 14, 1996, pp. 598/599.

Rao et al. : "Al and N Ion Implantations in 6H–SIC", Institute of Physics Conference Series, Sep. 18, 1995, pp. 521–524.

Wang et al.: "High barrier height GaN Schottky diodes: Pt/GaN and Pd/GaN", Physics Letters, vol. 68, No. 8, Feb. 26, 1996, pp. 1267–1269.

* cited by examiner

*Primary Examiner*—Allan R. Wilson
*Assistant Examiner*—Edgardo Ortiz
(74) *Attorney, Agent, or Firm*—Venable; Norman N. Kunitz

(57) ABSTRACT

The invention relates to a semiconductor component with adjacent Schottky (5) and pn (9) junctions positioned in a drift area (2, 10) of a semiconductor material. The invention also relates to a method for producing said semiconductor component.

25 Claims, 3 Drawing Sheets

SEMICONDUCTOR COMPONENT AND METHOD FOR PRODUCING THE SAME

BACKGROUND OF THE INVENTION

The invention relates to a semiconductor component with alternating Schottky and pn junctions and low-doped drift zones of a semiconductor material, which are arranged between the Schottky and pn junctions, as well as a method for producing a component.

In addition to pn diodes, Schottky diodes are also used as components for low operating voltages. Schottky diodes are distinguished through low on-state voltages and low switching losses. In order to reduce the field peaks occurring at the edge of the Schottky junction, so-called guard rings are frequently provided at the edge of the component. These guard rings reduce the field peaks occurring at the edge of the Schottky junction and advantageously contribute to the increase in the breakdown voltage of the component.

However, the series resistances in the component as well as the off-state leakage currents increase with an increase in the breakdown voltage of the diode, particularly with increased temperatures. A broader use of the Schottky diodes, which are in reality very simple technologically, is thus made more difficult.

The strong dependence of the off-state leakage current on the voltage, owing to the voltage-induced deformation of the energetic barrier of the Schottky junction, presents a particular problem. The Schottky barrier is reduced at the barrier by an applied off-stage voltage and therewith connected electrical field, so that the off-state leakage current increases strongly with the off-state voltage and can have very high values, even prior to the actual breakdown. In addition, the off-state currents show an exponential increase along with the temperature, owing to the underlying thermal emission mechanism, which results in an unfavorable rejection characteristic.

Schottky diodes made from different semiconductor materials are known. In the EP 380 340 A2, a Schottky diode made of SiC is described. In the article by L. Wang et al., "High Barrier Height GaN Schottky diodes: Pt/GaN and Pd/GaN" in Appl. Phys. Lett. 68(9), Feb. 26, 1996 1267–1269, Schottky diodes made of GaN are disclosed. The German Patent 42 10 402 A1 discloses Schottky diodes made of diamond lattice.

In literature, various approaches are described for improving the rejection characteristic, e.g. in B. M. Wilamowski, "Schottky Diodes with High Breakdown Voltages," Solid-State Electronics, vol. 26(5), p. 491–493, 1983, and in B. J. Baliga, "The Pinch Rectifier: A Low-Forward-Drop High-Speed Power Diode," IEEE Electron Device Letters, EDL-5(6), 1984. It is assumed therein that a screening reduces the electrical field intensity at the Schottky junction. The component described therein is a so-called "Merged-pn/Schottky (MPS) Rectifier," which has inside the guard ring arrangement alternating Schottky contacts and highly doped pn junctions with n-drift zones of a semiconductor material arranged in-between. To be sure, the rejection characteristic of these components is improved, but there are several disadvantages.

In addition to the loss of active surface for the Schottky junctions, in particular the injection of minority charge carriers from the highly doped semiconductor area is a disadvantage during the forward operation of the pn contacts. With a forward polarity of the MPS component, the current initially flows only over the Schottky regions. With further increasing forward voltage, the pn junctions also enter the passage range, wherein minority charge carriers are injected into the drift zone. In contrast to the components having only guard ring arrangements, this minority charge carrier injection cannot be neglected since the charge carrier injection can even result in the formation of electron-hole plasma, in the same way as for pure pn diodes. On the one hand, the passage properties are slightly improved while, on the other hand, the switching losses increase sharply.

Literature describes a series of measures for improving the switching behavior and rejection characteristic of the MPS components. The U.S. Pat. No. 5,262,669 A discloses arranging the pn junctions for MPS components in etched grooves, as well as adapting the geometry of the pn junctions to the barrier height of the Schottky junction or the space charge zone that forms at the Schottky junction. The technologies and arrangements used, however, are technologically very involved. For that reason, the MPS components are practically unimportant, despite their generally simple production technology and advantageous characteristics of unipolar diodes.

SUMMARY OF THE INVENTION

It is the object of the invention to provide a MPS component for which the switching losses are improved without the use of involved technological steps.

This object generally is solved by a semiconductor component with outer contacts as anode and cathode and a guard ring and comprising alternately arranged Schottky junctions and pn junctions arranged near the surface of the semiconductor component, as well as low-doped drift zones of a semiconductor material that are arranged between the Schottky junctions and the pn junctions; and wherein the energy difference ($E_{gap} - \Phi_{barrier}$) between the band gap ($E_{gap}$) in the electronic excitation range of the drift zone semiconductor material and the energetic height ($\Phi_{barrier}$) of the Schottky barrier is at least 0.8 eV in the non-voltage state of the semiconductor component and the band gap ($E_{gap}$) is higher than 1.5 eV. Modified and advantageous embodiments follow from the description.

The invention concerns an arrangement with a junction between Schottky metal and drift zone of a semiconductor, as well as a screening of pn junctions, which screening is essentially embedded in the above junction. A minimum difference between energetic height of the Schottky barrier and the energy gap of the semiconductor material must be maintained here for the selection of materials for semiconductor and Schottky metal.

It is advantageous if the simple technology of the MPS components can be used and the rejection characteristics as well as the shutdown losses are improved.

It is particularly advantageous if semiconductors with high-energy gap, particularly so-called 'wide-band gap' semiconductors, are used. It is favorable if the material for the Schottky contact is selected such that it does not fall below a minimum barrier height. The rejection characteristics are thus improved.

In one preferred embodiment, the drift zone consists of silicon carbide, while in another embodiment, the drift zone consists of gallium nitride. In a further embodiment, the drift zone consists of aluminum nitride while that of another one consists of diamond lattice.

In one preferred embodiment, a drift zone with identical type of conductivity but lower doping is arranged on a highly doped substrate material of silicon carbide. It is advantageous if a substrate material doping of higher or equal to $10^{18}$ cm$^{-3}$ and a drift zone doping of $10^{14}$ to $10^{17}$ cm$^{-3}$ is used.

One advantageous embodiment has a drift zone with a thickness of between 2 μm and 50 μm.

The distance between adjacent pn junctions for one preferred embodiment is between 0.5 μm and 20 μm.

In another preferred embodiment, the pn junctions are arranged in grooves that are etched into the inner drift zone.

The Schottky junctions of one preferred embodiment are arranged adjacent to the pn junctions in the drift zone.

The highly doped regions in the drift zone of one preferred embodiment are formed by the drift zone semiconductor material with complementary doping.

In another preferred embodiment, the highly doped regions in the drift zone are formed by different semiconductor materials.

One favorable embodiment has aluminum and/or boron inserted into the doping region for the p-doped substrate material.

Nitrogen and/or phosphor are inserted in one favorable embodiment for the n-doped substrate material.

The cathode and anode of another preferred embodiment are arranged on opposite surfaces of the semiconductor component.

One preferred embodiment provides that the cathode and anode are arranged on the same semiconductor component surface. In particular, one outer contact encloses the other outer contact.

An essentially pointed contacting occurs between an outer contact and the drift zone of one preferred embodiment.

In another preferred embodiment, a highly doped semiconductor region is positioned in front of the cathode, which region has the same type of conductivity as the drift zone of the semiconductor.

It is particularly favorable that a component according to the invention can also be designed as complementary doped component.

A method according to the invention specifies the production of a silicon carbide component according to the invention. In one preferred embodiment, a particularly favorable temperature treatment is carried out. The advantage is that the surface roughness of the component is not made worse during the temperature treatment.

SUMMARY OF THE INVENTION

The features, insofar as they are essential to the invention, are explained in detail in the following and with the aid of the Figures, wherein.

Figure 2:
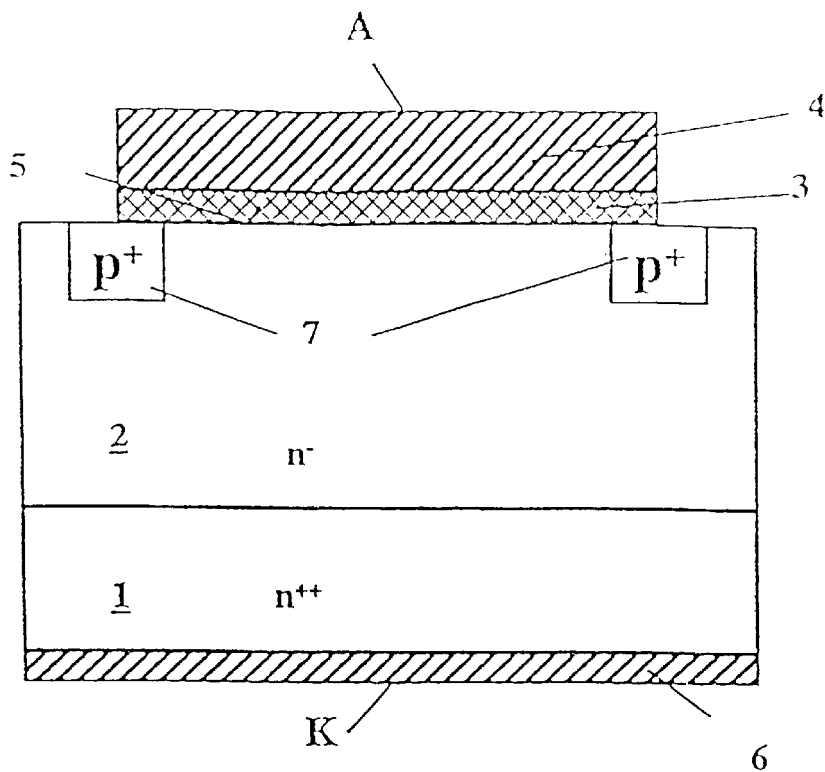
FIG. 2 Shows a section through a Schottky diode with guard ring, according to prior art.

FIG. 2 shows a section through a Schottky diode with guard ring, according to prior art. In the standard arrangement, a low-doped n_ semiconductor region 2, particularly an epitaxial layer, is arranged on a highly doped n substrate 1. A Schottky contact is arranged on the surface of the semiconductor layer 2, which is formed with a first metal layer, the Schottky metal 3, and a second contacting metal system 4. The Schottky junction 5 forms toward the semiconductor. The Schottky contact forms the anode A. On the side of substrate 1 that is opposite the anode A, a third contacting metal system 6 is arranged, which forms the cathode K. A highly doped semiconductor region 7 with a charge carrier type that complements that of the semiconductor region 2 is arranged below the edge region of the Schottky contact arrangement. The semiconductor region 2 represents the drift zone for the charge carrier. The semiconductor region 7 forms the protective ring (the so-called "guard ring"), which reduces the electrical field peaks that otherwise occur at the edge of the Schottky contact and thus increase its breakdown voltage.

Figure 3:
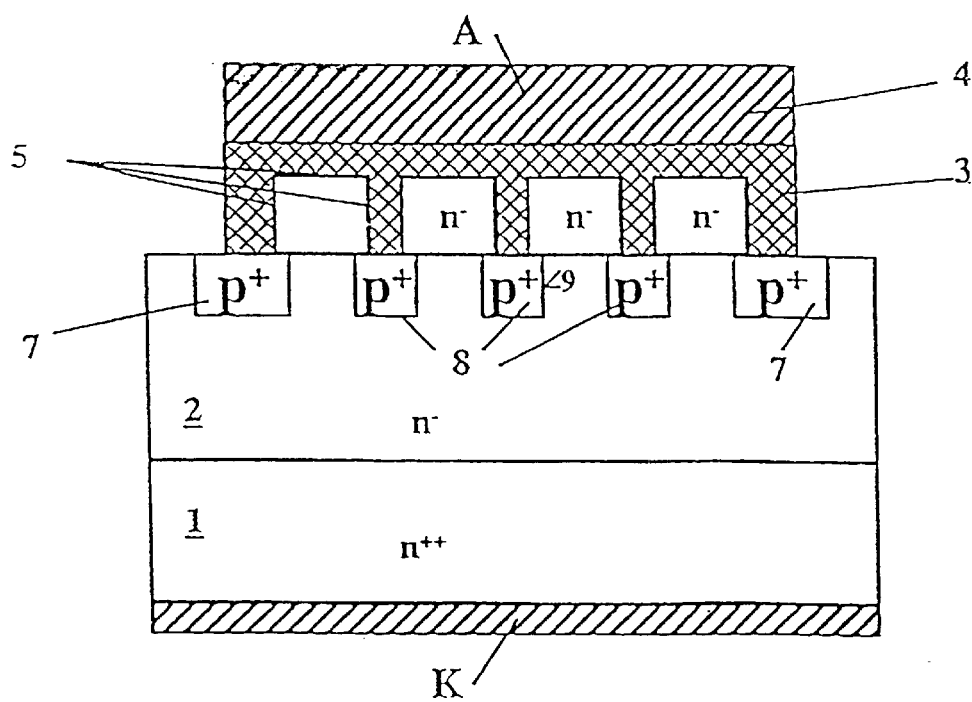
FIG. 3 Shows a section through a MPS component according to prior art.

FIG. 3 furthermore shows a modified version of the arrangement according to FIG. 2, in the form of a section through a standard MPS component according to the prior art. In this arrangement, the field peaks are further reduced through a screening below the Schottky contact. The screening consists of a grid of highly doped semiconductor regions 8, which contain a charge carrier type that is complementary to the semiconductor layer 2, i.e., the same as the guard ring 7. The screening arrangement 7 in FIG. 3 is formed by p-regions. Essentially, an arrangement is formed with alternately arranged Schottky junctions 5 and pn junctions 9, as well as drift zones 10 in-between.

If an off-state voltage is applied to this arrangement between anode A and cathode K, then the space charge zone expands with increasing voltage not only from the Schottky junction, but also from the semiconductor regions of the screening arrangement 8. With standard dimensioning, the Schottky regions are cut off between the p-regions 8 from their space charging zones, so that the electrical field intensity at the Schottky junction 5 barely increases further. This arrangement corresponds approximately to a cascode of a Schottky diode and a so-called 'static induction transistor.'

This structure per se already shows the advantageous reduction of the strong dependence of the off-state current on the voltage and results already in an improved rejection capacity of the MPS component. At the same time, the technological conversion of the structure is very simple. In particular, it is possible with standard diodes to create a screening arrangement 8 in the form of a lattice or other suitable geometry, particularly strips and points, in one technological step and together with the guard ring 7, if necessary also with several so-called field rings. There is no additional technological expenditure.

One disadvantage of the known structure is that active Schottky surface is lost. A great disadvantage is that during the forward operation of the component, minority charge carriers are injected from the screening regions 7 into the drift zone of the semiconductor region 2. With a forward polarity of the MPS component, the current initially flows only over the Schottky regions. With further increasing forward voltage, however, the pn junctions 9 are also subject to passage, wherein minority charge carriers are injected into the drift zones 2 and 10. As a result of the relatively large surface share of the screening arrangement 8, particularly the p+ regions, this injection can no longer be neglected, as is the case with the Schottky diodes with guard ring 7.

This occurrence can lead to the forming of an electron hole plasma in the drift zone of the semiconductor region 2, which improves the passage characteristics, to be sure, but causes considerable switching losses in the component.

According to the invention, a material combination is selected for the semiconductor material and the Schottky material, which ensures that the difference of the size of the energetic band gap in the electronic excitation spectrum of the semiconductor and the energetic height of the Schottky barrier in the non-voltage state of the component is higher or equal to a predetermined energy value, preferably at least 0.8 eV, and even more preferably at least 1 eV. Simplified, it can be assumed that for a pn junction a voltage is necessary that is higher by the difference value ΔU than is necessary for the Schottky contact in order to allow the same current $I_o$ to flow. The difference value ΔU for a MPS component according to the invention can simply be interpreted to be the voltage difference between a total current $I_o$, starting with a first voltage and the injection current with the same level as $I_o$, which starts with a second, higher voltage.

The relationship between the energy values and the voltage difference ΔU results in $\Delta U = (E_{gap} - \Phi_{barrier})/q_o + k$, wherein $E_{gap}$ is the energy gap of the semiconductor, $\Phi_{barrier}$ is the height of the Schottky barrier, $q_o$ the elementary charging constant and k the constant that depends on the effective Richardson constant, the temperature, the charge carrier state densities, the charge carrier mobility, the charge carrier life expectancy, the doping and the surface ratio between Schottky junction and pn junction surface. For standard parameter values of comparable components, k is in the range of several 10 mV to a few 100 mV and thus can essentially be neglected. The Schottky barrier $\Phi_{barrier}$ is preferably determined from the forward characteristic of the diode in the manner known per se.

The absolute values for the band gap $E_{gap}$ and the Schottky barrier $\Phi_{barrier}$ are not important for the voltage difference ΔU. Owing to the fact that the higher the voltage difference ΔU, the lower the switching losses, it makes sense to select suitable semiconductor Schottky material combinations.

Materials with a high band gap $E_{gap}$ should preferably be selected for the semiconductor materials. Particularly suitable are various poly types of silicon carbide, gallium nitride, aluminum nitride and diamond. When selecting the optimum Schottky contact material, it must be observed that on the one hand, the Schottky barrier $\Phi_{barrier}$ is small enough to achieve the highest possible energy difference between band gap $E_{gap}$ and Schottky barrier $\Phi_{barrier}$ height while, on the other hand, the Schottky barrier is high enough to achieve favorable rejection characteristics. It is particularly favorable if the Schottky barrier $\Phi_{barrier}$ height is selected higher than 0.5 eV, and in particular higher than 0.8 eV. It makes sense to have a Schottky barrier $\Phi_{barrier}$ height of less than 2 eV. Thus, the component according to the invention is particularly well suited for use in the high off-state voltage range, preferably for a range higher than 200 V and especially higher than 600 V.

Particularly advantageous as semiconductors are combinations of silicon carbide with metals, especially titanium, aluminum, palladium, gold, silver, nickel or metal combinations, particularly titanium/aluminum, titanium/nickel/silver or the like with suicides. In particular, these include $TiSi_2$ or other suitable metal/semiconductor combinations, which meet the requirement that the difference between band gap $E_{gap}$ and barrier Schottky $\Phi_{barrier}$ height must be higher or equal to 0.8 eV, preferably 1 eV.

Figure 1:
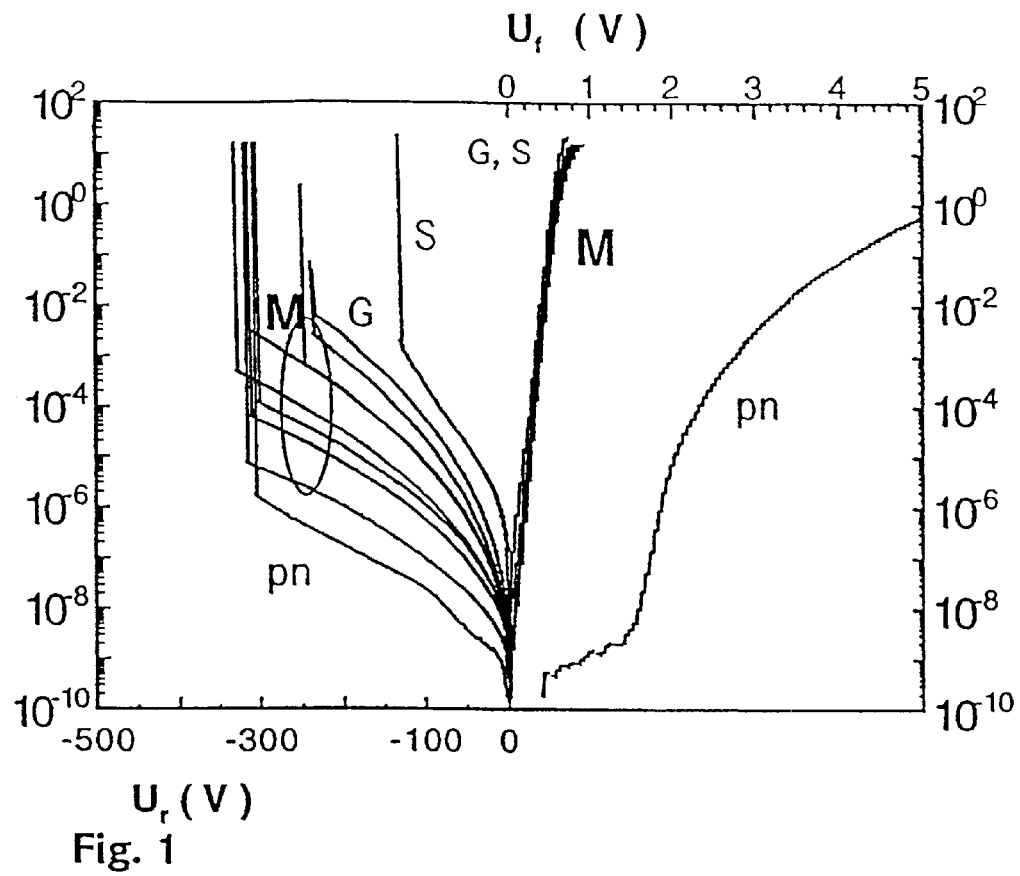
FIG. 1 Shows the course of characteristic curves for components according to the invention and that of curves for various known components.

If a MPS component with the material combination according to the invention is operated in forward direction, then the pn junctions 9 do not inject minority charge carriers into the drift zone of the semiconductor until clearly higher flux voltages exist. This is shown in FIG. 1. In that case, only a negligible injection occurs during the normal diode operation, so that no additional switching losses occur as a result of the so-called 'clearing out' of minority charge carriers from the drift zone, or owing to a possible return-flow peak. This is shown in FIG. 4.

In FIG. 1, a comparison is made in forward as well as off-state direction between measured characteristic curves for silicon carbide MPS components according to the invention, having different screening geometries M, and the characteristic curves of other components, particularly Schottky diodes S, Schottky diodes with guard ring G as well as pn diodes PN. The advantageous effect of the arrangement according to the invention is shown clearly. With the MPS components M according to the invention, a high current in forward direction flows at very low voltages already, similarly as for the components S and G that are favorable in forward direction. By comparison, clearly higher voltages must be applied to the pn diode PN for comparable flows. In the off-state direction, the leakage current for the MPS components M according to the invention is clearly lower than for the Schottky diodes S and G, with and without guard ring, and shows similarly favorable rejection characteristics as for the pn diode PN.

Figure 4:
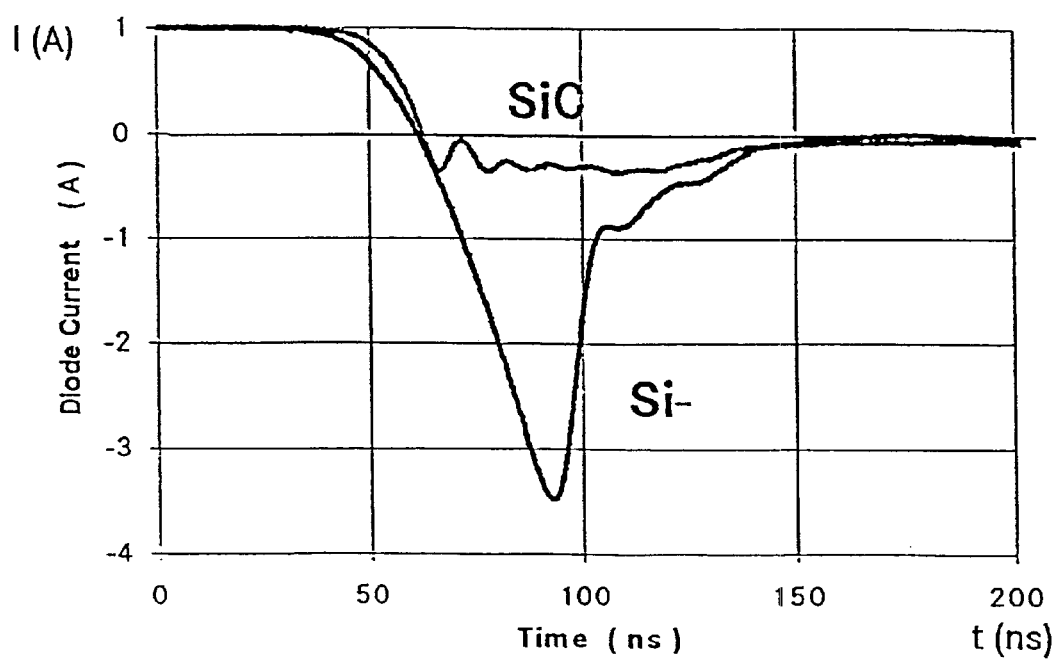
FIG. 4 Shows the characteristic shutdown curve for a component according to the invention, as compared to the curve for a pn diode according to prior art.

FIG. 4 shows the characteristic curves of a component according to the invention, made of SiC and those of a comparable component made of Si, which characterize the shut-down behavior of the components. The components are shut down by 1A forward current against 500 V off-state voltage. The Si component is a pn diode and demonstrates the characteristically poor shutdown behavior. The characteristic curve for the Si component drops sharply and shows a strong reverse recovery to high negative flows, which are considerably higher than the actual forward current of 1A. This can be traced back to the fact that numerous minority charge carriers must be removed from the drift zone of the semiconductor, which results in extremely disadvantageous switching behavior with high switching losses for the this Si component.

In contrast, only a few minority charge carriers exist in the drift zone for the component according to the invention, since the injection of these carriers is for the most part prevented by the voltage difference ΔU according to the invention. The current in the reverse recovery range therefore amounts to only a fraction of the actual forward current. The shutdown of the component according to the invention therefore occurs as quickly as that of pure Schottky diodes, for example, which are known for their rapid shutdown characteristics. However, the off-state losses are clearly improved. The switching losses as compared to the pn diodes are reduced considerably. Thus, the component according to the invention on the one had exhibits the favorable characteristics of the known Schottky diodes, e.g. reduced switching losses and simple technology, but also shows clearly lower off-state leakage currents.

The advantage of having lower switching losses with higher off-state stability, however, is also met for those components according to the invention, for which the off-state current behavior is not further improved owing to the particularly high energy gap of the semiconductor, provided the difference value between energy gap and Schottky barrier height is at least 0.8 eV, preferably at least 1 eV.

To be sure, the preferred embodiments of the MPS components according to the invention, illustrated in the Figures, show vertical components with the external connections for cathode K and anode A arranged on opposite surfaces of the semiconductor. However, a component according to the invention can also be designed as a lateral component where the external contacts for anode A and cathode K are arranged on the same surface of the semiconductor. In particular, the one external contact can enclose the other one, e.g. the cathode can surround the anode in the shape of a ring. In one preferred embodiment, an external contact, in particular the cathode K, contacts the semiconductor drift zone only in points.

In another preferred embodiment, a highly doped semiconductor region with the same conductivity type as the drift zone for the semiconductor 2 is arranged in front of the cathode. Advantageously, this results in an improved contact between semiconductor and cathode contact, and a possible expansion of the space charging zone toward the cathode metal 6 (so-called 'punch through') is thus cut off.

The invention also applies to MPS components with complementary doping.

In one preferred embodiment, highly doped n-conducting or p-conducting silicon carbide, preferably n-conducting 4H silicon carbide, is used as substrate 1, particularly one having more than $10^{18}$ cm$^{-3}$. The arrangement is similar to the one described in FIG. 3. A drift zone 2 with identical charge type as the substrate 1 is arranged on this substrate, preferably through homo-epitaxial precipitation. The thickness of the drift zone is preferably between 2 μm and 50 μm. The doping is preferably between approximately $10^{14}$ and $10^{17}$ cm$^{-3}$.

Doping material atoms are inserted structured into the drift zone 2, essentially in areas near the surface. Drift zone 10 and doping regions 7, 8 alternate. Aluminum or boron are preferably selected for a p-type drift zone and nitrogen or phosphor are selected for an n-type drift zone. The resulting regions 7 and 8 are of the opposite charge carrier type than the charge carrier type of drift zone 10 and form pn junctions 9.

The structured doping materials can be inserted into the surface of drift zone 2 by means of diffusion or, preferably, by means of ion implantation techniques. The spacing between doping regions 7 and 8 can be optimized, such that possibly existing nonoperative space charging zones of neighboring pn junctions 9 do not touch. As a result, the charge carrier passage in forward direction is not obstructed. On the other hand, the pn junctions 9 must be positioned close enough, so that if an off-state voltage is present at the component, the region between neighboring pn junctions 9 is securely cut off by the space charging zones in region 10, which expand with the increasing off-state voltage.

In addition to the doping and the semiconductor material, the optimum distance between the pn junctions 9 also depends on the geometry of the pn screening 8, which in particular can have a strip, lattice, ring, spiral, hexagonal or point structure.

It is preferable if the distance between neighboring pn junctions is between 0.5 μm and 20 μm.

A temperature treatment preferably follows the insertion of the screening, especially one between 1400° C. and 1700° C., which heals possible implantation damage, drives the doping material deeper and thermally activates the material. Particularly advantageous is a multi-stage temperature treatment, as disclosed in the German Patent Applications DE 196 33 183 and DE 196 33 184. These applications disclose the temperature treatment of semiconductor components with volatile, particularly sublimating components, especially silicon carbide. The method consists of carrying out the temperature treatment in such a way that the component is kept for a limited interval first at a temperature of between 500° C. and 1500° C. and subsequently at a temperature of more than 1500° C. It is particularly advantageous if during the temperature treatment silicon is added directly adjacent to the component, particularly in a possibly existing healing pan in which the component is stored during the temperature treatment. This has the particular advantage that the surface of the MPS component remains smooth during the actual healing step, owing to a preceding conditioning step, despite the high temperature. Subsequently, the meallization for the front (Schottky metal) and rear (ohmic contact) is deposited, is structured and, if necessary, thermally treated.

Figure 5:
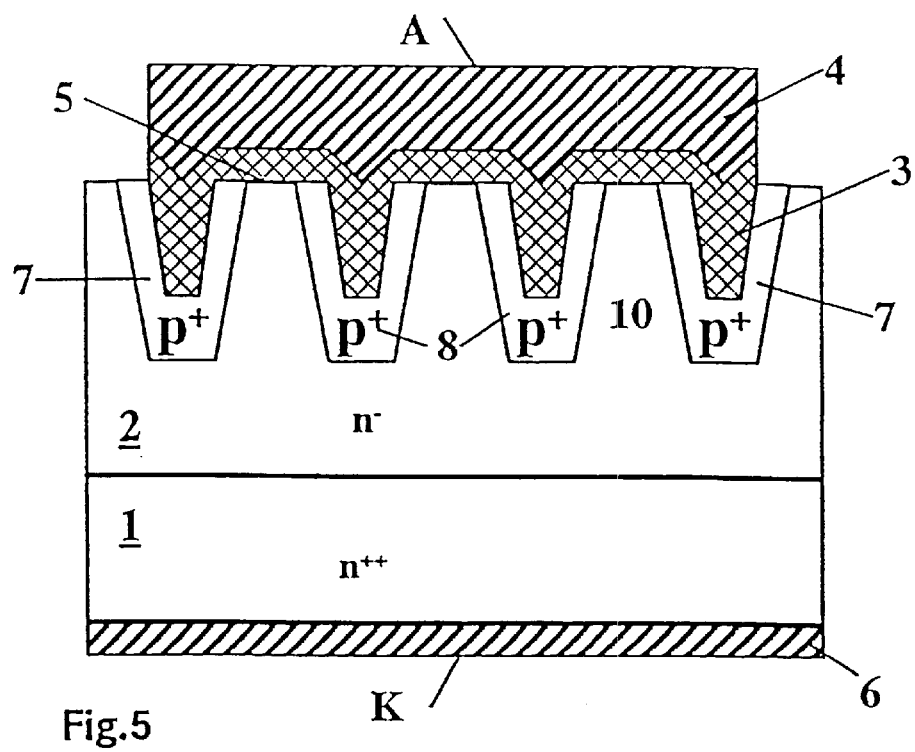
FIG. 5 Shows a section through a MPS component according to the invention.

FIG. 5 shows a component according to the invention, into which grooves are etched in the drift zone 2 prior to inserting the doping for the screening and at the locations intended for the screening. This has the advantage that the pn junctions extend far into the drift zone 2, thereby improving the cut-off of the Schottky regions.

Figure 6:
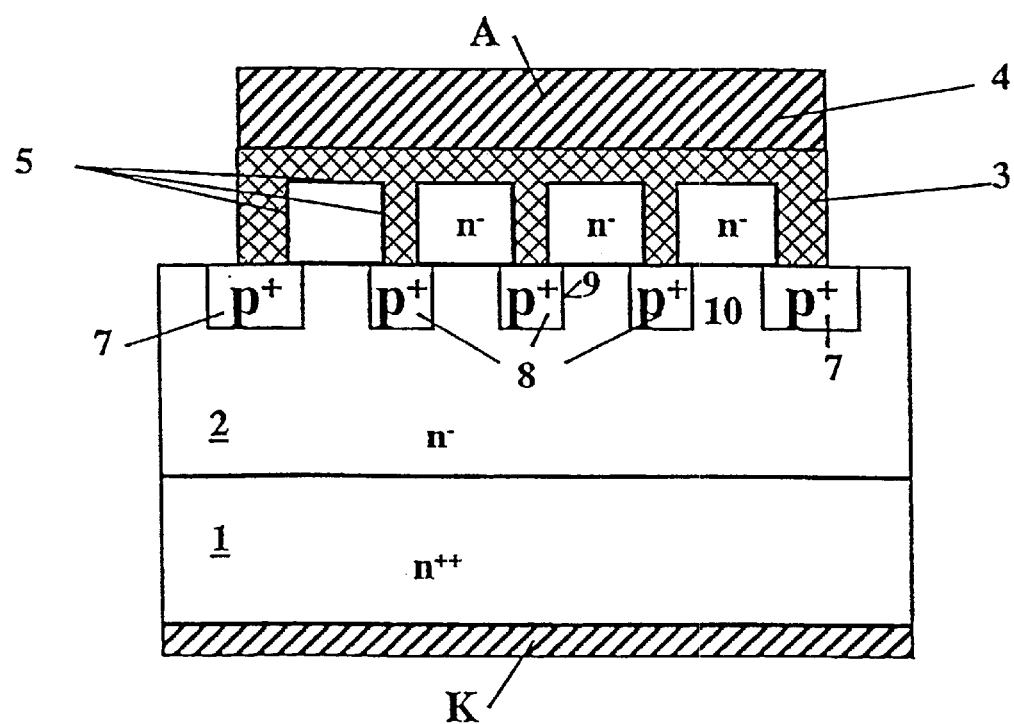
FIG. 6 Shows a section through a MPS component according to the invention.

In another preferred arrangement that is shown in FIG. 6, an epitaxial layer is deposited after the screening zones 8 are installed, which epitaxial layer has the same conductivity as the drift zone 2. Consequently, the screening zones 8 are buried. The screening zones are subsequently freed again, particularly etched free and are metallized only after that. In this way, the active Schottky surface is expanded by the side surfaces of the etched areas, which at least compensates, in particular over-compensates, for the surface loss due to the screening zones 8.

What is claimed is:

1. A merged pn/Schottky semiconductor component with outer contacts as anode and cathode and a guard ring, and comprising alternately arranged Schottky junctions and pn junctions arranged near the surface of the semiconductor component, as well as low-doped drift zones of a semiconductor material that are arranged between the Schottky junctions and the pn junctions, and wherein the energy difference ($E_{gap}-\Phi_{barrier}$) between the band gap ($E_{gap}$) in the electronic excitation range of the drift zone semiconductor material and the energetic height ($\Phi_{barrier}$) of the Schottky barrier is at least 0.8 eV in the non-voltage state of the semiconductor component and the band gap ($E_{gap}$) is higher than 1.5 eV.

2. A semiconductor component according to claim 1, wherein the energy difference ($E_{gap}-\Phi_{barrier}$) is at least 2 eV.

3. A semiconductor component according to claim 1 wherein the energetic height of the Schottky barrier ($\Phi_{barrier}$) is less than 2 eV.

4. A semiconductor component according to claim 1, wherein the energetic height of the Schottky barrier ($\Phi_{barrier}$) is higher than 0.5 eV.

5. A semiconductor component according to claim 1, wherein the semiconductor material of the drift zones is silicon carbide.

6. A semiconductor component according to claim 1, wherein the semiconductor material of the drift zones is gallium nitride.

7. A semiconductor component according to claim 1, wherein the semiconductor material of the drift zones is aluminum nitride.

8. A semiconductor component according to claim 1, wherein the semiconductor material of the drift zones is diamond.

9. A semiconductor component according to claim 1, wherein the drift zones with identical conductivity type but lower doping are arranged on a highly doped substrate material of silicon carbide.

10. A semiconductor component according claim 1, wherein the substrate material is doped with a doping higher than or equal to $10^{18}$ cm$^{-3}$.

11. A semiconductor component according claim 1, wherein the drift zone region is doped with a doping of $10^{14}$ cm$^{-3}$ to $10^{17}$ cm$^{-3}$.

12. A semiconductor component according to claim 1, wherein the drift zone region has a thickness of between 2 µm and 50 µm.

13. A semiconductor component according to claim 1, wherein the distance between neighboring pn junctions is between 0.5 µm and 20 µm.

14. A semiconductor component according to claim 1, wherein the pn junctions are arranged in grooves that are etched into the inner drift zone.

15. A semiconductor component according to claim 1, wherein the Schottky junctions are arranged adjacent to the pn junctions in the drift zone.

16. A semiconductor component according to claim 1, wherein doping regions, which are inserted into the drift zone, are formed by the semiconductor material of the drift zone with complementary doping.

17. A semiconductor component according to claim 16, wherein the doping regions and the drift zone are formed with different semiconductor material.

18. A semiconductor component according to claim 1, wherein at least one of aluminum and boron is inserted into the drift zone for the p-doped substrate material.

19. A semiconductor component according to claim 1, wherein at least one of nitrogen and phosphorous is inserted into the drift zone for the n-doped substrate material.

20. A semiconductor component according to claim 1, wherein the cathode (K) and the anode (A) are arranged on opposite surfaces of the semiconductor component.

21. A semiconductor component according to claim 1, wherein the cathode (K) and the anode (A) are arranged on the same surface of the semiconductor component.

22. A semiconductor component according to claim 20 wherein the one outer contact (K, A) encloses the other outer contact (A, K).

23. A semiconductor component according to claim 1, wherein an outer contact (A, K) essentially makes contact with the drift zone at points.

24. A semiconductor component according to claim 1, wherein a highly doped semiconductor region is located in front of the cathode, which region has the same conductivity type as the drift zone of the semiconductor component.

25. A semiconductor component according to claim 1, wherein the semiconductor component has a complementary doping type.

* * * * *